(12) United States Patent
Wang et al.

(10) Patent No.: US 11,309,209 B2
(45) Date of Patent: Apr. 19, 2022

(54) WAFER HOLDER AND WAFER TRANSFER APPARATUS, SYSTEM AND METHOD

(71) Applicant: SHANGHAI MICRO ELECTRONICS EQUIPMENT (GROUP) CO., LTD., Shanghai (CN)

(72) Inventors: Gang Wang, Shanghai (CN); Rongjun Zhang, Shanghai (CN); Xiaoyu Jiang, Shanghai (CN); Yichao Shi, Shanghai (CN); Kai Liu, Shanghai (CN); Junpeng Chen, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 57 days.

(21) Appl. No.: 16/499,695

(22) PCT Filed: Mar. 29, 2018

(86) PCT No.: PCT/CN2018/080976
§ 371 (c)(1),
(2) Date: Sep. 30, 2019

(87) PCT Pub. No.: WO2018/177341
PCT Pub. Date: Oct. 4, 2018

(65) Prior Publication Data
US 2020/0286772 A1 Sep. 10, 2020

(30) Foreign Application Priority Data
Mar. 31, 2017 (CN) .......................... 201710210557.1

(51) Int. Cl.
*H01L 21/68* (2006.01)
*H01L 21/683* (2006.01)
(Continued)

(52) U.S. Cl.
CPC .......... *H01L 21/6838* (2013.01); *B65G 47/91* (2013.01); *H01L 21/67017* (2013.01);
(Continued)

(58) Field of Classification Search
CPC combination set(s) only.
See application file for complete search history.

(56) References Cited

U.S. PATENT DOCUMENTS 8,899,650 B2 * 12/2014 Furuta ................. B65G 47/918
294/188
2004/0041420 A1 3/2004 Hayes
2015/0146187 A1 5/2015 Toyomaki

FOREIGN PATENT DOCUMENTS

CN 101295661 A 10/2008
CN 102150252 A 8/2011
(Continued)

*Primary Examiner* — Ronald P Jarrett
(74) *Attorney, Agent, or Firm* — Muncy, Geissler, Olds & Lowe, P.C.

(57) ABSTRACT

A wafer holder and a wafer transfer apparatus, system and method are disclosed. The wafer holder is mounted onto the wafer transfer apparatus and includes a holder body and a sucker. The holder body defines a first opening, while the sucker includes a first skirt. The first skirt is located on one side of the holder body and connected to the first opening. A groove is formed at a joint between the first skirt and the first opening. The groove is located at an outer side of the first skirt, and is able to relief stresses produced at a base portion of the sucker during deformation of the first skirt.

29 Claims, 7 Drawing Sheets

(51) Int. Cl.
    *B65G 47/91*     (2006.01)
    *H01L 21/67*     (2006.01)
    *H01L 21/677*     (2006.01)

(52) U.S. Cl.
    CPC .. *H01L 21/67742* (2013.01); *H01L 21/67754* (2013.01); *H01L 21/67766* (2013.01)

(56) References Cited

FOREIGN PATENT DOCUMENTS

| | | |
|---|---|---|
| CN | 202189768 U | 4/2012 |
| CN | 103035553 A | 4/2013 |
| CN | 203006472 U | 6/2013 |
| CN | 203064798 U | 7/2013 |
| CN | 203300622 U | 11/2013 |
| CN | 203926341 U | 11/2014 |
| CN | 104516209 A | 4/2015 |
| CN | 204287728 U | 4/2015 |
| CN | 104875212 A | 9/2015 |
| CN | 206032681 U | 3/2017 |
| JP | H-03270048 A | 12/1991 |
| JP | H-08107136 A | 4/1996 |
| JP | H-1086086 A | 4/1998 |
| JP | H-1133774 A | 12/1999 |
| JP | 2001110871 A | 4/2001 |
| JP | 2001179672 A | 7/2001 |
| JP | 2003225879 A | 8/2003 |
| JP | 2003-282694 A | 10/2003 |
| JP | 2015013358 A | 1/2015 |
| JP | 2016538711 A | 12/2016 |
| KR | 20100077523 A | 7/2010 |
| TW | 201540444 A | 11/2015 |

\* cited by examiner

WAFER HOLDER AND WAFER TRANSFER APPARATUS, SYSTEM AND METHOD

TECHNICAL FIELD

The present disclosure relates to semiconductor technology and, in particular to a wafer holder and a wafer transfer apparatus, system and method.

BACKGROUND

In the field of semiconductor, robotic arms are used to retain wafers on their fork-shaped holders by vacuum forces and then move to transport the retained wafers. With the development of semiconductor technology, thinning processes and bonding processes cause a certain degree of warpage in a wafer, and when loaded on a fork-shaped wafer holder, some portions of the wafer will not come into contact with a suction surface of the holder and leave air gaps therebetween, which may undermine the vacuum retention ability of the holder.

Therefore, it is desired to design a wafer holder and a wafer transfer apparatus, system and method for effectively holding warped wafers.

SUMMARY OF THE DISCLOSURE

An objective of the present disclosure is to provide such a wafer holder and a wafer transfer apparatus, system and method, to overcome the problem of failure in holding warped wafers with conventional wafer holders.

To this end, the present disclosure provides a wafer holder, comprising a holder body and a sucker, wherein
the holder body defines a first opening; and
the sucker comprises a first skirt, wherein the first skirt is located on one side of the holder body and connected to the first opening, a groove is formed at a joint between the first skirt and the first opening, and is located at an outer side of the first skirt.

Optionally, the first opening is circular and the holder body has a shape of a hollow cylinder.

Optionally, the first opening has a diameter ranging from 8.2 mm to 9.0 mm.

Optionally, the holder body has an outer diameter ranging from 13.0 mm to 17.0 mm and a height ranging from 0.4 mm to 0.6 mm.

Optionally, the first skirt has a shape of a truncated cone and the groove is formed in a surface of the holder body and is annular.

Optionally, the first skirt has an outer diameter ranging from 15.0 mm to 17.0 mm.

Optionally, the first skirt has a height ranging from 0.8 mm to 1.6 mm.

Optionally, the first skirt has an exterior surface, and an angle between the exterior surface and a top surface of the holder body ranges from 18° to 24°.

Optionally, the first skirt has an interior surface, and an angle between the interior surface and top surface of the holder body ranges from 16° to 23°.

Optionally, the groove has a depth ranging from 0.2 mm to 0.3 mm.

Optionally, the groove has an inner diameter ranging from 9.8 mm to 10.6 mm.

Optionally, the groove has a bottom width ranging from 0.3 mm to 0.5 mm.

Optionally, the groove comprises a first side wall and a second side wall, wherein the first side wall is closer to the first opening and the second side wall is farther away from the first opening.

Optionally, the first side wall is recessed at a middle position thereof toward the first opening to appear as an annular curved surface.

Optionally, the second side wall is slanted away from the first opening at an angle ranging from 90° to 180°.

The present disclosure also provides a wafer transfer apparatus, comprising an apparatus body and a plurality of wafer holders of any one of claims 1 to 15, wherein the plurality of wafer holders are secured to the apparatus body.

Optionally, the wafer transfer apparatus further comprises a plurality of wafer supports and a seal, wherein:
the apparatus body defines a plurality of first holes being circular and comprises a bottom surface in which a trench is formed in communication with the first holes;
the apparatus body further comprises a top surface, each of the wafer supports is cylindrical and defines a second hole in center, each of the wafer supports is received in a corresponding one of the first holes in such a manner that it protrudes out from the top surface of the apparatus body and into the first opening of a corresponding one of the wafer holders but located below the first skirt of the wafer holder; and
the seal is attached to the bottom surface of the apparatus body, and spaces within the trench, the first holes and the second holes together form a gas channel.

Optionally, numbers of the wafer holders and wafer supports are greater than 3 and equal to each other, with centers of the wafer supports defining a polygon.

Optionally, when the wafer transfer apparatus is transferring a wafer, the first skirts together support the wafer in such a manner that a center of gravity of the wafer is encompassed by the polygon.

Optionally, the wafer transfer apparatus further comprises an evacuation device configured to evacuate the gas channel to form a vacuum therein when the wafer transfer apparatus is transferring a wafer.

Optionally, each of the wafer supports has a first end and a second end, the first end having a diameter greater than a diameter of the first hole, the second end having a diameter smaller than a diameter of the first hole, the first end received in the first opening so that a top surface of the first end is higher than the top surface of the apparatus body while a bottom surface of the second end is lower than the top surface of the apparatus body.

Optionally, upon formation of vacuum in the gas channel, the wafer support is brought into contact with a wafer as a result of deformation of the first skirt.

Optionally, when the wafer is in contact with the wafer support, a weight of the wafer exceeds a support force provided by the first skirt to the wafer.

Optionally, each of the wafer holders further comprises a first fixing member configured to secure the wafer holder to the apparatus body, and wherein the holder body has a front side on which the first skirt is located and a back side on which the first fixing member is located.

Optionally, the first fixing member comprises a second skirt and a third skirt,
the second and third skirts both coupled to the holder body, the second skirt surrounding the first opening, the third skirt surrounding the second skirt, the second and third skirts together forming a V-shaped groove.

Optionally, the first fixing member further comprises a bottom surface of the sucker, which is located between the second and third skirts, and wherein when the wafer transfer apparatus is transferring a wafer, the second skirt, the third skirt and the bottom surface of the sucker are pressed against the apparatus body.

Optionally, when the wafer transfer apparatus is transferring the wafer, the holder body turns into a flat sheet-like shape.

Optionally, the apparatus body further comprises suction surfaces each surrounding a corresponding one of the first holes and a body surface, the suction surfaces being lower than the body surface, the suction surfaces each having an annular shape, and wherein when the wafer transfer apparatus is transferring the wafer, the second skirt, the third skirt and the bottom surface of the sucker are pressed against a corresponding one of the suction surfaces.

Optionally, the second skirt pressed against the suction surface has an inner diameter greater than a diameter of a first end and the third skirt pressed against the suction surface has an outer diameter smaller than an outer diameter of the suction surface.

Optionally, each of the wafer holders is secured to the apparatus body by means of a second fixing member comprising a flange, the flange defining a second opening which is aligned with the first opening of the wafer holder and larger in size than the first opening, the flange configured to press the holder body against the apparatus body.

Optionally, the second fixing member further comprises a plurality of screws configured to fasten the flange to the apparatus body.

Optionally, each of the wafer holders is made of a silicone rubber and is subjected to a surface finish treatment for reducing particulates thereon.

Optionally, each of the wafer holders is made of a material having a Shore hardness of 45 HS to 55 HS.

The present disclosure also provides a wafer transfer system, comprising the wafer transfer apparatus described above, a robotic arm and a wafer cassette, the wafer transfer apparatus secured to the robotic arm, the robotic arm configured to move the wafer transfer apparatus into the wafer cassette to pick up or place a wafer from or into the wafer cassette, the robotic arm further configured to move the wafer transfer apparatus to transfer the wafer.

Optionally, the wafer cassette comprises a plurality of wafer slots configured to store wafers.

Optionally, the sum of a thickness of the wafer transfer apparatus, a thickness of the wafer, a height difference between a lower position for entry of the wafer transfer apparatus into the wafer cassette and a higher position for exit of the wafer transfer apparatus from the wafer cassette is less than a slot-to-slot space of the wafer cassette.

The present disclosure also provides a wafer transfer method, using the wafer transfer apparatus described above, the method comprising:

securing the wafer holders to the wafer transfer apparatus by pressing the first fixing members;

positioning the wafer transfer apparatus under a wafer with the wafer holders facing upward and placing the wafer onto the first skirts of the wafer holders; and evacuating a gas channel in the wafer transfer apparatus and forming a vacuum therein;

wherein, the first skirts deform and keep deforming at the grooves which are each formed at an outer side of a bottom of a corresponding one of the first skirts until the wafer comes into contact with wafer supports.

In the wafer holder and wafer transfer apparatus, system and method of the present disclosure, the groove provided at the outer side of the joint between the first skirt and the first opening is able to relieve stresses produced at a base portion of the sucker during deformation of the first skirt. In this way, compared to a wafer holder without such a groove, the wafer holder allows the first skirt to experience a greater amount of deformation with the same thickness or the same amount of deformation with an increased thickness. As a result, in the case that the first skirt experiences a greater amount of deformation with the same thickness, the wafer holder can accommodate a wafer with a greater warpage to avoid air leakage in vacuuming the space formed by a suction surface of the wafer. Moreover, in the case that the first skirt has an increased thickness with the same deformability, the first skirt will be tougher in structure and less prone to damage during use. As a result, the first skirt will experience less wear and tear, so its service life and even that of the wafer holder will be extended. This can dispense with the need for frequent replacement of the wafer holder and resulting in enhanced production efficiency.

Additionally, the increased deformability allows a wafer to be effectively brought into contact with the wafer supports and the first skirt provides supporting forces not exceeding the wafer's weight. In other words, the wafer can tightly adhere to the wafer supports and thus be transferred with high accuracy during with the frictional force between the wafer supports and the wafer is greater than zero. The wafer supports are designed to support a warped wafer and provide it with friction during its movement, which can prevent the wafer from displacement relative to the wafer transfer apparatus body so that the wafer will be always secured to the wafer holders without the risk of slipping off the apparatus.

Furthermore, according to the present disclosure, the second and third skirts in each first fixing member are compressed against a smooth surface, so the holder body can be retained on the apparatus body by a pressure difference between the interior and the exterior of the first fixing member. That is, the first fixing member functions in the same way as a vacuum sucker to fixedly fasten the wafer holder onto the wafer transfer apparatus. This allows easy, efficient attachment and replacement of the wafer holder simply by a pressing action. By contrast, conventional rubber wafer holders are attached to wafer transfer apparatuses by adhesives. When such a wafer holder is detached for replacement, adhesive residues tend to remain on the surface of the apparatus body and the holder body, which require a cumbersome long-lasting removal process involving washing, wiping and even use of a scraper and probably leaving scratches on the surface of the apparatus body. Moreover, this conventional approach requires an additional room between the holder and the transfer apparatus for accommodating the adhesive, which may deteriorate the accuracy in wafer transfer. Therefore, the apparatus according to this embodiment allows more efficient replacement of wafer holders with a shortened process cycle and improved wafer transfer accuracy.

According to this embodiment, with the suction surface, which is lower than the body surface, and against which the second skirt, third skirt and the bottom surface of the sucker are tightly pressed, the apparatus body can have a reduced overall vertical dimension. In addition, in order to facilitate secure mounting for the wafer holder, the suction surface may be a smooth, dense surface with a size greater than those of the compressed second and third skirts.

Specifically, according to the present disclosure, with the more than three wafer holders and the same number of wafer supports whose centers define a polygon, during the transport of a wafer by the wafer transfer apparatus, the wafer can be stably supported on the first skirts with its center of gravity encompassed within the polygon.

After the wafer holder is mounted to the transfer apparatus, a vertical distance between top surfaces of the first skirt and wafer support determines an amount of wafer warpage that the wafer holder can accommodate. Therefore, the greater the deformation of the first skirt is, the more sufficiently the wafer holder can accommodate the wafer warpage. While an increase in the skirt thickness can result in an extended service life of the skirt, but it is unfavorable to the deformability thereof. According to the present disclosure, the annular groove can either enhance the deformability with an increased skirt thickness or maintain the deformability with an even increased skirt thickness. Furthermore, since the wafer holders on the apparatus can be distributed in a circular pattern encompassed by the outline of a wafer, the transfer apparatus having the wafer holders can accommodate a great wafer warpage than the wafer warpage a single wafer holder can accommodate.

The wafer holder of the present disclosure can be also used in wafer pre-alignment apparatuses whose functions involve the fixation or transfer of wafers. Similarly, in this case, the wafer holder will well accommodate wafer warpage, enhance transfer accuracy and allows for more reliable retention.

In these figures, 1 denotes a wafer holder; 11 denotes a holder body; 111 denotes a first opening; 112 denotes a groove; 1121 denotes a first side wall; 1122 denotes a second side wall; 1123 denotes a bottom surface of the groove; 113 denotes a top surface; 12 denotes a sucker; 121 denotes a first skirt; 13 denotes a first fixing member; 131 denotes a second skirt; 132 denotes a third skirt; 133 denotes a bottom surface of the sucker; 14 denotes a second fixing member; 141 denotes a flange; 142 denotes a second opening; 143 denotes a screw; 2 denotes an apparatus body; 21 denotes a first hole; 22 denotes a trench; 23 denotes a suction surface; 24 denotes a body surface; 3 denotes a wafer support; 31 denotes a second hole; 32 denotes a first end; 33 denotes a second end; and 4 denotes a seal.

DETAILED DESCRIPTION

Specific embodiments of the present disclosure will be described in greater detail below with reference to the accompanying drawings. Features and advantages of the disclosure will become more apparent from the following detailed description, and from the appended claims. Note that the accompanying drawings are provided in a very simplified form not necessarily presented to scale, and their only intention is to facilitate convenience and clarity in explaining the disclosed embodiments.

The core concept of the present disclosure is to overcome the problem of failure in holding warped wafer with conventional wafer holders by presenting a novel wafer holder and wafer transfer apparatus, system and method.

Following this concept, the present disclosure provides a wafer holder and wafer transfer apparatus, system and method. The wafer holder is mounted on the wafer transfer apparatus and includes a holder body and a sucker. The holder body defines a first opening, while the sucker includes a first skirt. The first skirt is located on one side of the holder body and connected to the first opening. A groove is formed at a joint between the first skirt and the first opening, and is located at an outer side of the first skirt.

Embodiment 1

Figure 1:
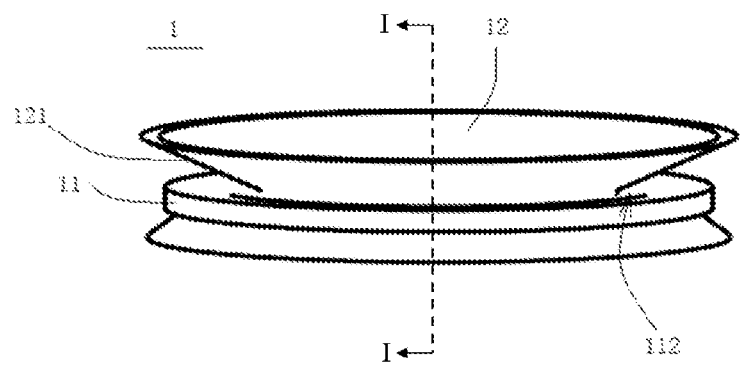
FIGS. 1-2 are structural schematics of a wafer holder according to the present disclosure.
Figure 2:
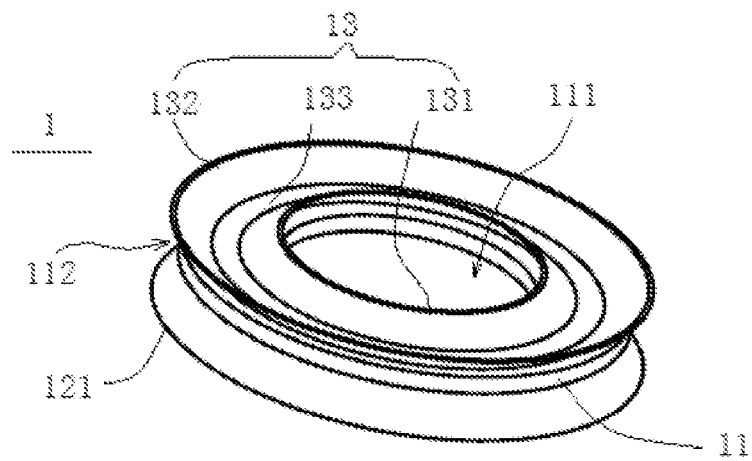
Figure 3:
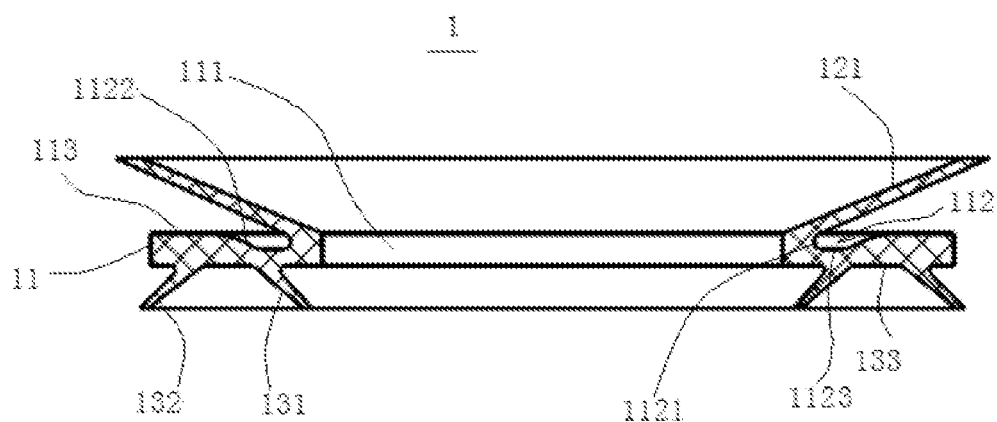
FIGS. 3-4 show cross-sectional views of the wafer holder along the broken line I-I of FIG. 1 according to the present disclosure.
Figure 4:
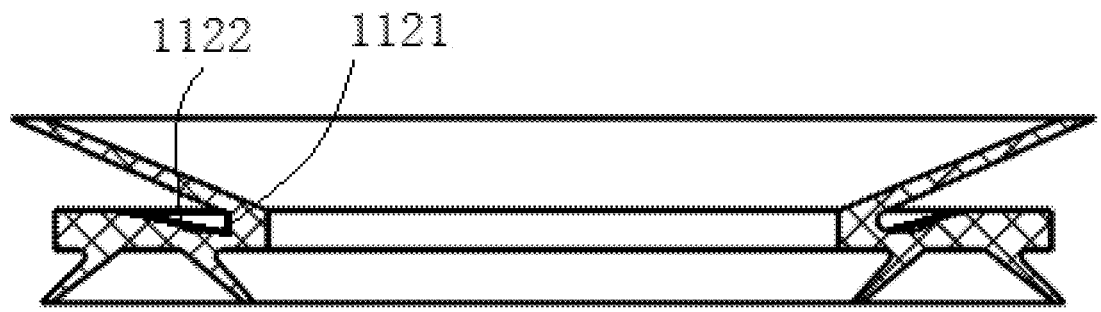

FIGS. 1 to 2 are structural schematics of a wafer holder according to a first embodiment of the present disclosure. As shown, the wafer holder 1 includes a holder body 11 and a sucker 12. The holder body 11 defines a first opening 111, while the sucker 12 includes a first skirt 121 that is located on one side of the holder body 11 and connected at the bottom to the first opening 111. FIGS. 3-4 show schematic cross-sectional views of the wafer holder. As shown, a groove 112 is formed at the joint between the first skirt 121 and the first opening 111, and is located at an outer side of the first skirt 121.

Specifically, as shown in FIGS. 3 to 4, the first opening 111 may be circular, while the holder body 11 may appear, in general, as a hollow cylinder, with an internal surface delimiting the first opening 111. The first skirt 121 may have a general shape of a truncated cone and may be formed of an elastic wall connected at the bottom to the internal surface of the holder body 11. The groove 112 may be formed in the surface of the holder body 11 and located at an outer side of the first skirt 121. The groove 112 may be annular and have a first side wall 1121 closer to the first opening 111 and a second side wall 1122 farther away from the first opening 111. The first side wall 1121 may be recessed at its middle toward the first opening 111, thus appearing in general as an annular curved surface. The second side wall 1122 may be slanted away from the first opening 111 at an angle in the range of 90°-180°. The first side wall 1121 and the second side wall 1122 may be either connected to each other via a bottom surface 1123 of the groove (as shown in FIG. 3) or directly connected together (i.e., without the intervening bottom surface, as shown in FIG. 4). Preferably, the groove 112 may have a rectangular cross-section rounded at the corners. Alternatively, the groove 112 may also have any other possible cross-section, such as a corner-rounded triangle, that allow a sufficient amount of deformation of the skirt.

In the wafer holder according to this embodiment, the groove provided at the joint between the first skirt 121 and the first opening 111 is able to relieve stresses produced at a base portion of the sucker 12 during deformation of the first skirt 121. In this way, compared to a wafer holder without such a groove, the wafer holder 1 allows the first skirt to experience a greater amount of deformation with the same thickness or the same amount of deformation with an increased thickness. As a result, in the case that the first skirt 121 experiences a greater amount of deformation with the same thickness, the wafer holder 1 can accommodate a wafer with a greater warpage to avoid air leakage in vacuuming the space formed by a suction surface of the wafer. Moreover, in the case that the first skirt 121 has an increased thickness with the same deformability, the first skirt 121 will be tougher in structure and less prone to damage during use. In this case, the first skirt 121 and even the wafer holder 1 will have an extended service life, dispensing with the need for frequent replacement of the wafer holder and resulting in enhanced production efficiency.

Figure 5:
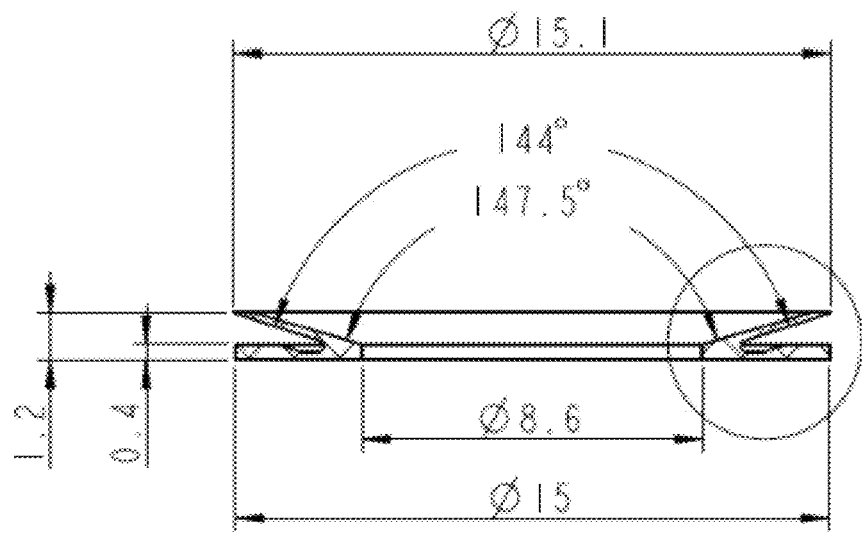
FIG. 5-8 show cross-sectional views of the wafer holder along the broken line I-I of FIG. 1 according to the present disclosure, wherein dimensions of a first skirt and a groove in the wafer holder are shown.
Figure 6:
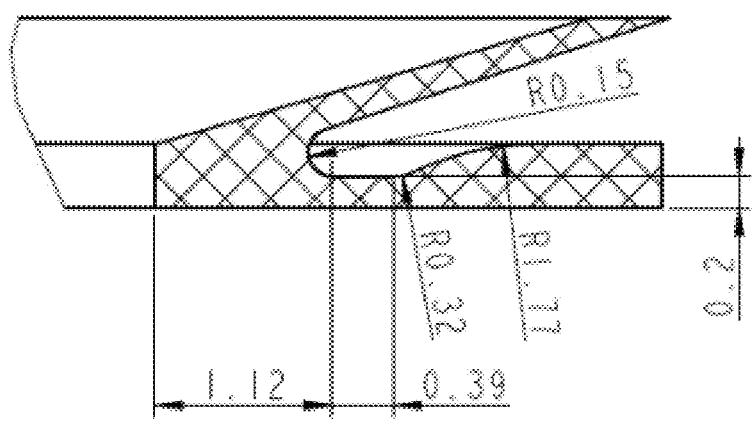
Figure 7:
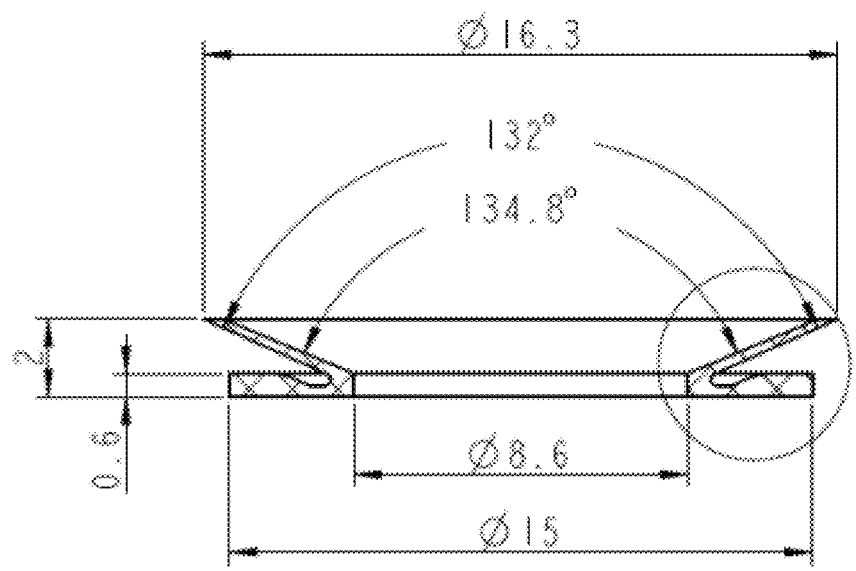
Figure 8:
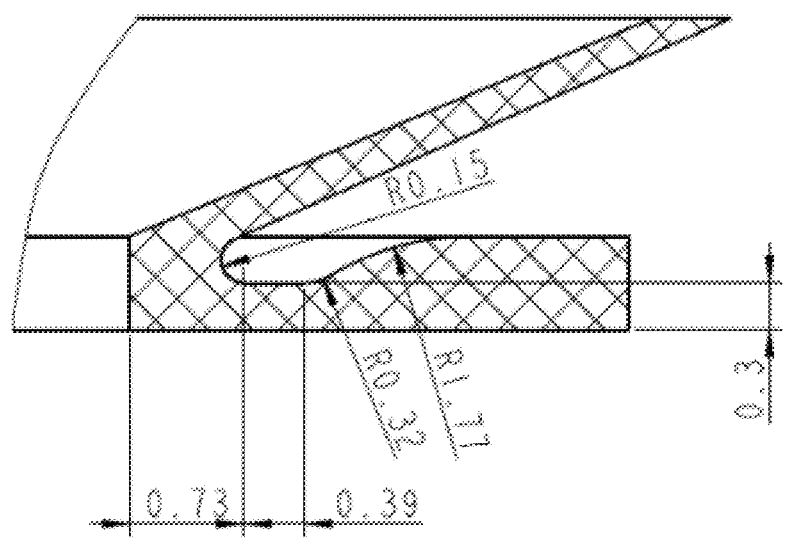

FIGS. 5 to 8 schematically illustrate preferred dimensions of the first skirt and groove according to embodiments thereof. The embodiment of FIGS. 5 to 6 is suitable for a wafer cassette fully loaded with 6" or 8" wafers (i.e., all available slots in the cassette are populated) with an amount of warpage within ±1 mm, while the embodiment of FIGS. 7 to 8 is suitable for a wafer cassette fully loaded with 12" wafers or loaded with 6" or 8" wafers at an interval of one empty slot (i.e., every adjacent two of the wafers are separated from each other by one empty slot), with an amount of warpage within ±5 mm Specifically, as shown in FIGS. 5 to 8, the first opening 111 may have a diameter ranging from 8.2 mm to 9.0 mm, such as for example, 8.4 mm, 8.6 mm, 8.9 mm, etc. The holder body 11 may have an outer diameter ranging from 13.0 mm to 17.0 mm, such as for example, 13.5 mm, 14 mm, 15 mm, 16.5 mm, etc. In order for the wafer holder 1 and groove 112 to meet the design requirements in terms of structural strength, the holder body 11 may have a height in the range of from 0.4 mm to 0.6 mm, such as for example, 0.4 mm, 0.46 mm, 0.52 mm, 0.6 mm, etc. Although a greater thickness of the first skirt 121 will lead to higher strength and a longer service life thereof, it is unfavorable to the deformability of the first skirt 121 and hence wafer transfer accuracy and is likely to eventually cause failure of the wafer holder 1 in meeting its expectations, the first skirt 121 may have an outer diameter ranging from 15.0 mm to 17.0 mm, such as for example, 15.1 mm, 15.8 mm, 16.3 mm, 16.9 mm, etc., and a height in the range of 0.8 mm to 1.6 mm, such as for example, 0.8 mm, 1.1 mm, 1.4 mm, 1.6 mm, etc. Additionally, the first skirt 121 may have an exterior surface and an interior surface, wherein an angle between the exterior surface and a top surface 113 of the holder body 11 ranges from 18° to 24°, such as for example, 18°, 20°, 22°, 24°, etc., and an angle between the interior surface and the same top surface 113 at an angle ranging from 16° to 23°, such as for example, 16.25°, 17.5°, 20°, 22.6°. While an increase in the depth of the groove 112 (i.e., the distance from the bottom surface 1123 or from the deepest point of the groove 112 to the top surface 113 of the holder body 11) or in the width thereof (which increases in proportion to the angle between the exterior surface of the first skirt 121 and the top surface 113 of the holder body 11) will lead to a rise in the deformability of the first skirt 121, a greater depth of the groove 112 will make the wafer holder 1 more bulky in the Z-direction and thus possibly unable to meet its expectations. Therefore, the depth of the groove 112 may range from 0.2 mm to 0.3 mm, such as for example, 0.2 mm, 0.25 mm, 0.3 mm, etc. Moreover, the groove 112 may have an inner diameter in the range from 9.8 mm and 10.6 mm, such as for example, 9.8 mm, 10.25 mm, 10.6 mm, etc., and a bottom width in the range from 0.3 mm to 0.5 mm, such as for example, 0.39 mm, 0.45 mm, 0.5 mm, etc.

According to this embodiment, the design of the wafer holder 1 and groove 112 relies on factors including dimensions of the wafer, wafer cassette and wafer transfer apparatus as well as the warpage of the wafer. The more significantly the wafer warps, the greater the dimension of the first skirt in the vertical direction (also referred to as the Z-direction hereinafter), i.e., its height, is required to be.

Embodiment 2

In this embodiment, a wafer transfer apparatus is provided. The wafer transfer apparatus includes an apparatus body 2 and a plurality of the wafer holders 1 of Embodiment 1. The wafer holders 1 are all mounted onto the apparatus body 2 and each include a holder body 11 and a sucker 12. The holder body 11 defines a first opening 111, while the sucker 12 includes a first skirt 121 that is located on one side of the holder body 11 and connected to the first opening 111. A groove 112 is formed at the joint between the first skirt 121 and the first opening 111, and is located at an outer side of the first skirt 121.

The wafer transfer apparatus may further include a plurality of wafer supports 3 and a seal 4. The seal 4 may be a sheet-like component. The apparatus body 2 may define a plurality of first holes 21 being circular and have a bottom surface in which a trench 22 is formed in communication with the first holes 21 and a top surface. The wafer supports 3 may be cylindrical components each defining a second hole 31 in the center. Each of the wafer supports 3 may be disposed in a corresponding one of the first holes 21 in such a manner that it protrudes out from the top surface of the apparatus body 2 into the first opening 111 of a corresponding one of the wafer holders 1 but located below the first skirt 121 of the respective wafer holder 1. The seal 4 may be attached to the bottom surface of the apparatus body 2 so that the spaces within the trench 22, the first hole 21, the second hole 31 and the first skirts 121 together form a gas channel.

In each of the wafer holders in the wafer transfer apparatus according to this embodiment, the groove 112, which is provided at the joint between the first skirt 121 and the first opening 111 and is located at an outer side of the first skirt 121, is able to relieve stresses produced at a base portion of the sucker 12 during deformation of the first skirt. In this way, compared to the wafer holders without such grooves, the first skirts 121 can deform more significantly with the same thickness, thus bringing a wafer into effective contact with the wafer supports and providing the wafer with supporting forces not exceeding the wafer's weight. In other words, the wafer can tightly adhere to the wafer supports and thus be transferred with high accuracy during which the frictional force between the wafer supports and the wafer is greater than zero. The wafer supports are designed to support a warped wafer and provide it with friction during its movement, which can prevent the wafer from displacement relative to the wafer transfer apparatus body so that the wafer will be always secured to the wafer holders without the risk of slipping off the apparatus.

Figure 9:
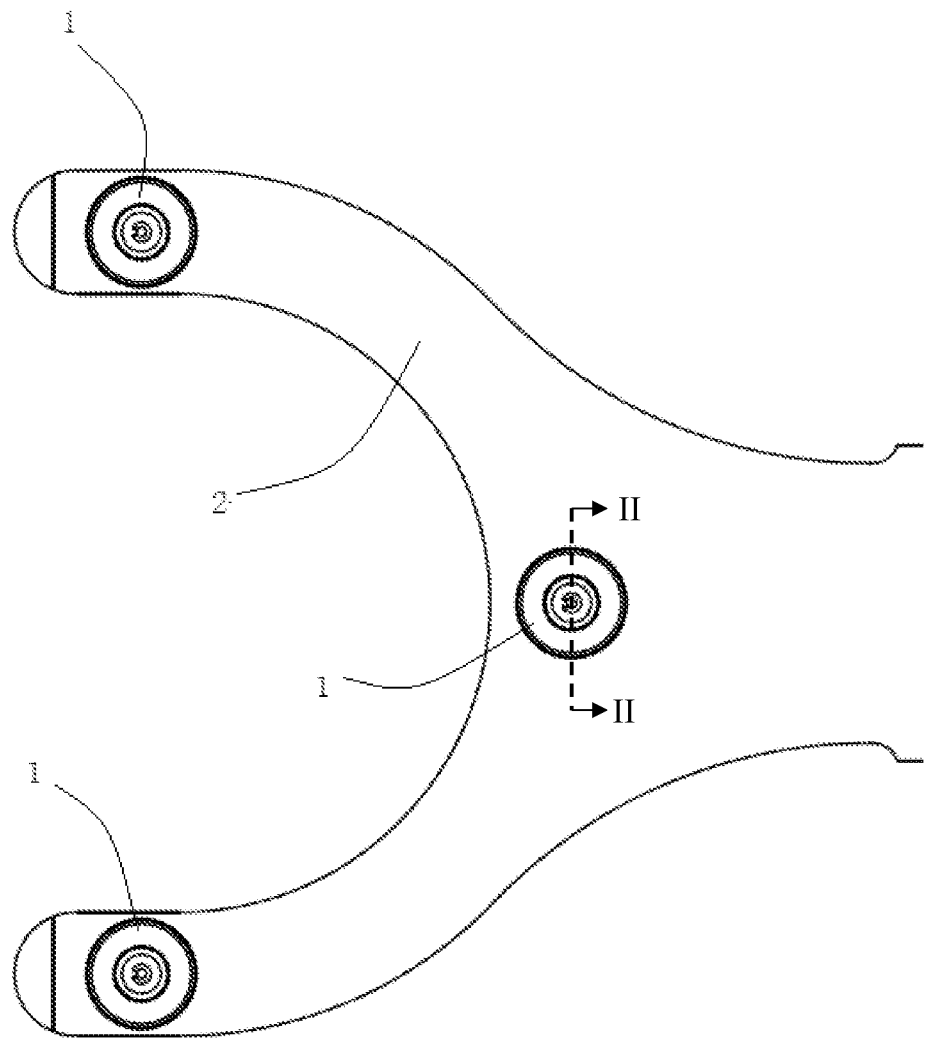
FIG. 9 is a schematic diagram of a wafer transfer apparatus according to the present disclosure.

FIG. 9 is a schematic illustration of the wafer transfer apparatus according to this embodiment. As shown, the numbers of the wafer holders 1 and the wafer supports 3 may be equal to each other and both greater than three. Centers of the wafer supports 3 may define a polygon, and when the apparatus is transferring a wafer, the first skirts 121 work together to support the wafer so that the center of gravity of the wafer is encompassed within the polygon. The apparatus may further include an evacuation device disposed in communication with the trench 22, which can evacuate gas channel to form a vacuum therein, thus allowing the apparatus to suck and transport a wafer.

According to this embodiment, with the more than three wafer holders 1 and the same number of wafer supports 3 whose centers define a polygon, during the transport of a wafer by the apparatus, the wafer can be stably supported on the first skirts with its center of gravity encompassed within the polygon.

Figure 10:
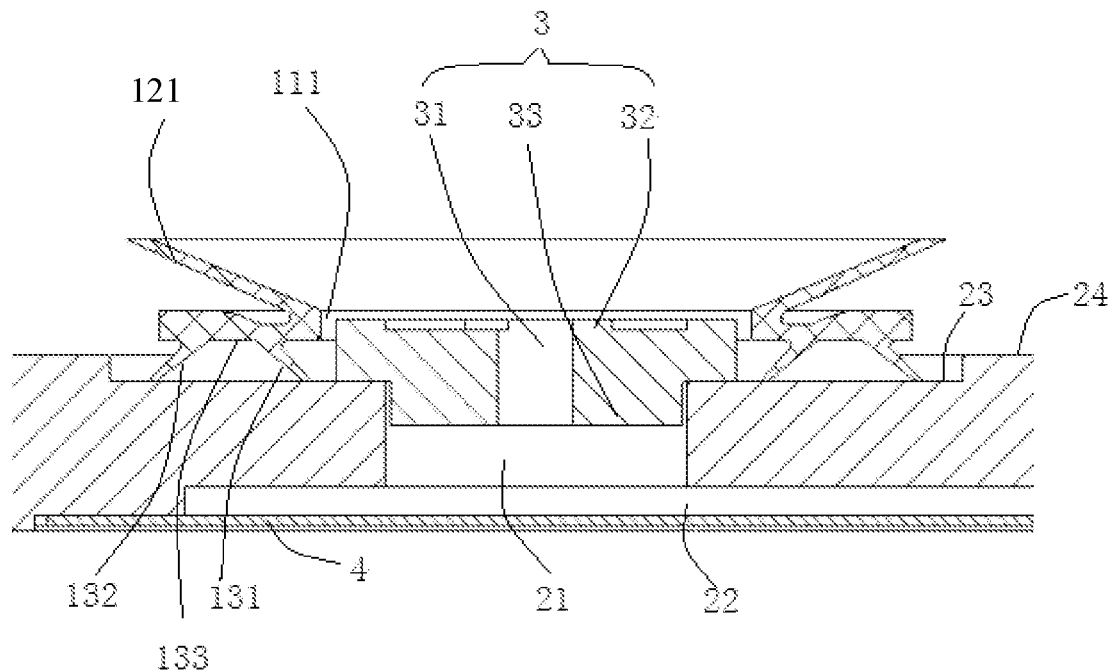
FIGS. 10-12 show cross-sectional views of the wafer holder mounted on the wafer transfer apparatus along the broken line II-II of FIG. 9 according to the present disclosure.

Further, as shown in FIG. 10, in the apparatus, each of the wafer supports 3 may have a first end 32 (which is an upper end as shown) and a second end 33 (which is a lower end as shown). The first end 32 may have a diameter greater than that of a corresponding one of the first holes 21, while the second end 33 may have a diameter less than that of the specific hole 21. The wafer support 3 may be inserted in the first opening 111 in such a manner that a top surface thereof at the first end 32 is above the top surface of the apparatus body 2 and a bottom surface thereof at the second end 33 is lower than the top surface of the apparatus body 2. With this design, after the gas channel is evacuated, the first skirts 121 will be deformed to bring the wafer into contact with the wafer supports 3 and provide the wafer with a supporting force not exceeding the wafer's weight.

Figure 11:
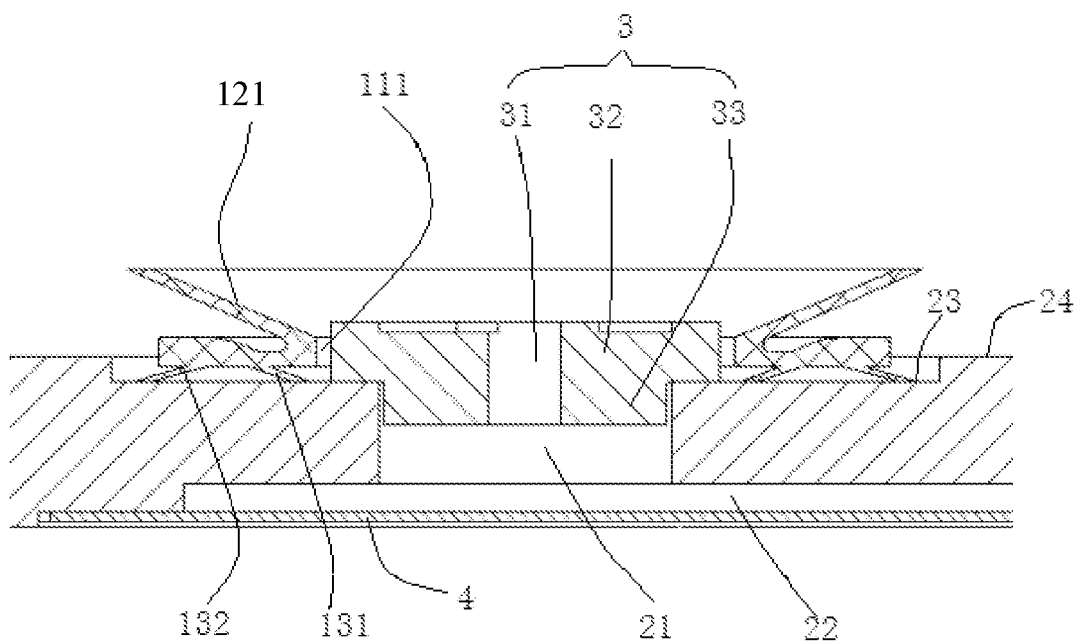
Figure 12:
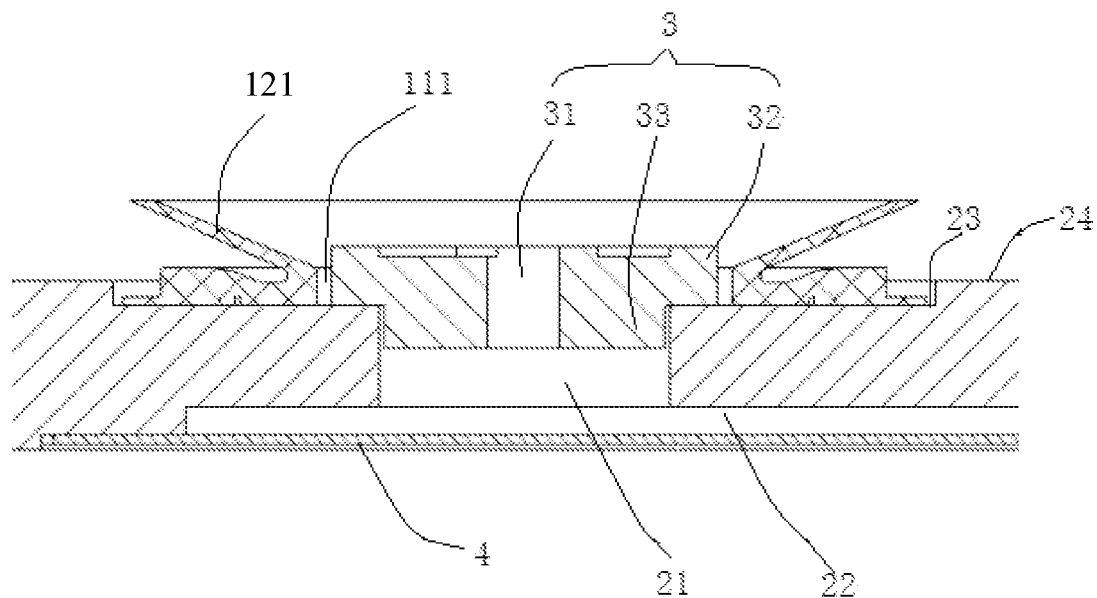

Additionally, referring to FIG. 2, which schematically illustrates a back side of one of the wafer holders 1, the wafer holder 1 may further include a first fixing member 13 disposed on the back side. The first fixing member 13 may be annular. As shown in FIG. 10, each of the wafer holders 1 may be secured to the apparatus body 2 by means of the first fixing member 13. The holder body 11 may have a front side with the first skirt 121 formed thereon and a back side with the first fixing member 13 formed thereon. The first fixing member 13 may include a second skirt 131 and a third skirt 132, each of which is joined to the holder body 11. The second skirt 131 may surround the first opening 111 and, in turn, be surrounded by the third skirt 132. The second and third skirts 131, 132 may together define a V-shaped groove. The first fixing member 13 may further include a bottom surface 133 of the sucker, which is located between the second skirt 131 and the third skirt 132. Each of the second and third skirts 131, 132 may be made from elastic material. With combined reference to FIGS. 10 to 12, the second and third skirts 131, 132 may both be compressed under the action of an external force, thus transitioning from an original configuration shown in FIG. 10 to an incompletely compressed configuration shown in FIG. 11 and further to a completely compressed configuration shown in FIG. 12. As shown in FIG. 12, when the wafer transfer apparatus is transporting a wafer, the second skirt 131, third skirt 132 and bottom surface 133 of the sucker are tightly pressed against the apparatus body 2 so that the holder body 11 generally appears like a flat plate.

According to this embodiment, when the second and third skirts 131, 132 in the first fixing member 13 are compressed against the smooth surface of the apparatus body 2, the holder body 11 will be retained on the apparatus body 2 by a pressure difference between the interior and exterior of the first fixing member 13. That is, the first fixing member 13 functions in the same way as a vacuum sucker to fixedly fasten the wafer holder 1 onto the wafer transfer apparatus by a simple pressing action. This allows easy, efficient attachment and replacement of the wafer holder. By contrast, conventional rubber wafer holders are attached to wafer transfer apparatuses by adhesives. When such a wafer holder is detached for replacement, adhesive residues tend to remain on the surfaces of the apparatus body and the holder body, which require a cumbersome long-lasting removal process involving washing, wiping and even use of a scraper and probably leaving scratches on the surface of the apparatus body. Moreover, this conventional approach requires an additional room between the holder and the transfer apparatus for accommodating the adhesive, which may deteriorate the accuracy in wafer transfer. Therefore, the apparatus according to this embodiment allows more efficient replacement of wafer holders with a shortened process cycle and improved wafer transfer accuracy.

Specifically, the apparatus body 2 may further include suction surfaces 23 each surrounding a corresponding one of the first holes 21 and a body surface 24 higher than the suction surfaces 23. The suction surface 23 may be annular. As shown in FIG. 12, the wafer holder is mounted to the apparatus, and all of the second skirt 131, third skirt 132 and the bottom surface 133 of the sucker may be tightly pressed against the suction surface 23. In this configuration, the second skirt 131 may have an inner diameter greater than the diameter of the first end 32, and the third skirt 132 may have an outer diameter less than an outer diameter of the suction surface 23.

According to this embodiment, with the suction surface 23, which is lower than the body surface 24, and against which the second skirt 131, third skirt 132 and the bottom surface 133 of the sucker are tightly pressed, the apparatus body 2 can have a reduced overall vertical dimension. In addition, in order to facilitate secure mounting for the wafer holder, the suction surface 23 may be a smooth, dense surface with a size greater than those of the compressed second and third skirts 131, 132.

After the wafer holder is mounted to the transfer apparatus, a vertical distance between top surfaces of the first skirt and wafer support determines an amount of wafer warpage that the wafer holder can accommodate. Therefore, the greater the deformation of the first skirt is, the more sufficiently the wafer holder can accommodate the wafer warpage. While an increase in the skirt thickness can result in an extended service life of the skirt, but it is unfavorable to the deformability thereof. According to the present disclosure, the annular groove can either enhance the deformability with an increased skirt thickness or maintain the deformability with an even increased skirt thickness. Furthermore, since the wafer holders on the apparatus are distributed (e.g., in a circular pattern) within the outline of a wafer, the transfer apparatus having the wafer holders can accommodate a greater wafer warpage than the wafer warpage a single wafer holder can accommodate.

Figure 13:
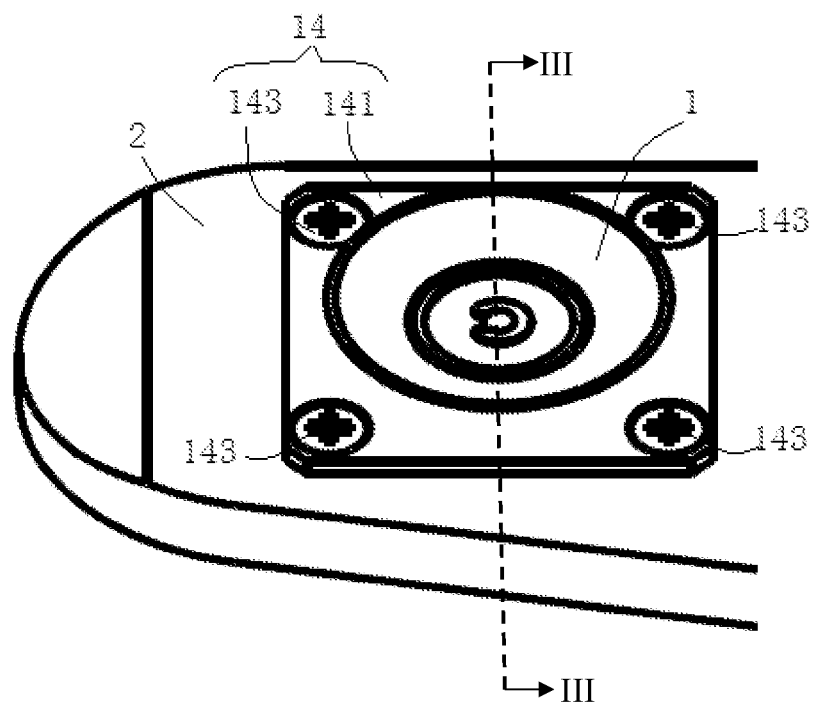
FIG. 13 shows a wafer holder mounted on the wafer transfer apparatus according to the present disclosure.
Figure 14:
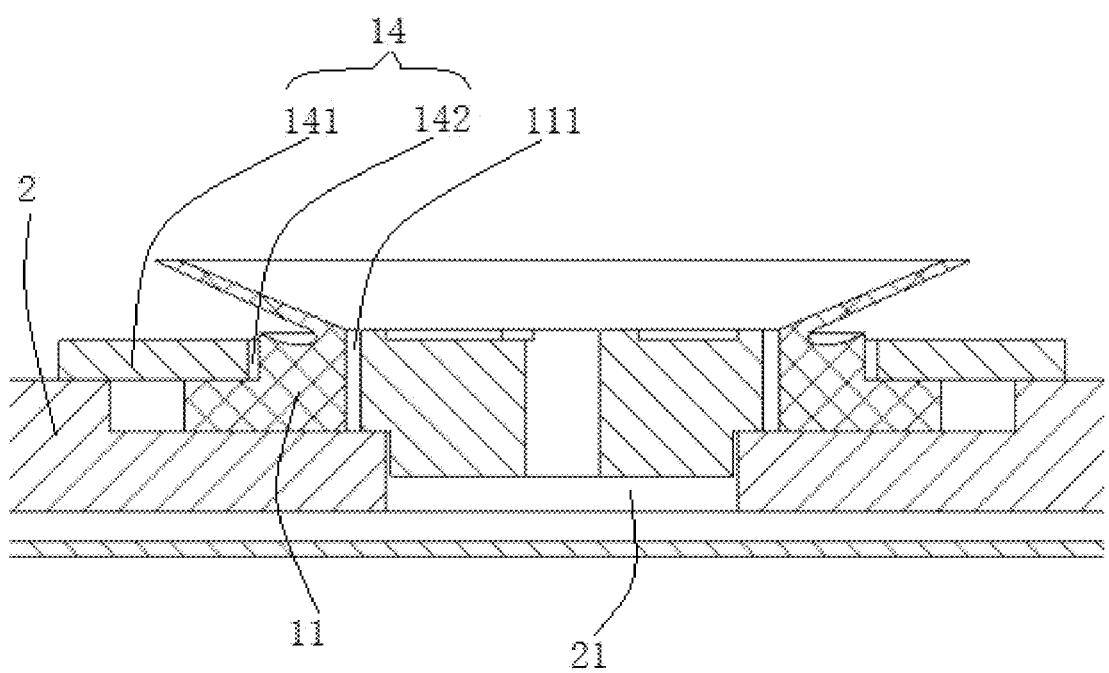
FIG. 14 shows a cross-sectional view of the wafer holder along the broken line III-III of FIG. 13 according to the present disclosure.

In this embodiment, another method for securing the wafer holders to the wafer transfer apparatus is provided. FIGS. 13 to 14 are schematic cross-sectional views of the wafer holders which are secured to the apparatus using a flange and screws. As illustrated, each of the wafer holders 1 may be secured to the apparatus body 2 by a second fixing member 14, which includes a flange 141 defining therein a second opening 142 having an inner diameter greater than that of the first opening 111 and aligned with the first opening 111. With the flange 141, the holder body 11 can be pressed against the apparatus body 2. The second fixing member 14 may further include a plurality of screws 143 for fastening the flange 141 to the apparatus body 2.

Specifically, the wafer holder 1 may be fabricated from a silicone rubber which can reduce the adhesion of contaminants to the surface of the wafer holder 1 and does not release components that can adhere to the wafer transfer apparatus. In addition, the silicone rubber can provide excellent electro-static discharge protection and may be departiculated. In addition, the surface of the wafer holder 1 may also be subjected to a finish treatment for reducing particulates thereon. Moreover, the suction surface 23 of the apparatus body 2, on which the first fixing member 13 is retained, is preferably a smooth, dense surface. The material of the wafer holder 1 may have a hardness that is high enough to allow the wafer holder 1 to withstand its own weight. To this end, the material of the wafer holder 1 is preferred to have a Shore hardness of 45 HS-55 HS.

While various configurations of the wafer transfer apparatus according to this embodiment has been described in detail above, it is a matter of course that the present disclosure is not limited to those described configurations and other configurations are still possible without departing from the scope thereof. Accordingly, it is intended that any modification to the above-described configurations, made by a person of ordinary skill in the art in light of the teachings hereinabove, falls within the scope of the disclosure.

Embodiment 3

According to the present embodiment, a wafer transfer system is provided. The wafer transfer system includes the wafer transfer apparatus of Embodiment 2, a robotic arm and a wafer cassette. The wafer transfer apparatus is secured to the robotic arm which is configured to move the wafer transfer apparatus into the wafer cassette to pick up or place a wafer from or into the wafer cassette, so that the wafer can be transported by the wafer transfer apparatus moving with the robotic arm.

Specifically, the wafer cassette may include a plurality of wafer slots for storing wafers. The sum of a thickness of the wafer transfer apparatus (i.e., a thickness of the apparatus body plus a thickness of the wafer holders), a thickness of any stored wafer, a height difference between a lower position for entry of the wafer transfer apparatus into the wafer cassette and a higher position for exit of the wafer transfer apparatus from the wafer cassette may be less than a slot-to-slot space of the wafer cassette.

Currently, rubber-based suckers in various forms, such as corrugated and bowl-like suckers, can be used to suck up and retain warped wafers. However, these conventional suckers have large vertical dimensions. Wafers are usually stored in wafer cassettes fabricated in compliance with industry standards. A wafer cassette typically has 25 slots, each of which can store one wafer. Such slots are also made in accordance with industry standards requiring a slot-to-slot space of, for example, 10 mm for 12" wafer cassettes, 6.35 mm for 8" wafer cassettes and 4.76 mm for 6" wafer cassettes. For a wafer cassette fully populated with 25 wafers, each Z-directional slot-to-slot space equals to the sum of a wafer thickness, a thickness of the wafer warpage, a thickness of the apparatus body, a thickness of the wafer holders, a height difference between a lower position for entry of the wafer transfer apparatus into the wafer cassette and a higher position for exit of the wafer transfer apparatus from the wafer cassette, a space allowance for the removal/placement operation of the wafer. Therefore, the wafer holders are required to reduce their Z-direction size as much as possible while ensuring accommodation of warpage of the wafers. Rubber-based suckers in various forms, such as corrugated and bowl-like suckers, are not suitable for warped wafers to be stored in wafer cassettes due to the large Z-direction size. Instead, in current practice in the art, annular rubber rings are usually used to handle warped wafers, which are, however, incapable of accommodating large wafer warpage.

The wafer transfer system according to this embodiment can handle wafers for use in a variety of processes and the wafer holders incorporated therein make it suitable for handling warped wafers. These wafer holders have a reduced vertical size and can accommodate wafer warpage thanks to the grooves surrounding their first skirts, which enhances the deformability of the first skirts and thus allows higher wafer transfer accuracy.

In order to verify the wafer transfer performance of the wafer holders 1 according to this embodiment, a pre-alignment apparatus in the wafer transport system is used as a measurement apparatus for analyzing the wafer transfer accuracy, wherein the pre-alignment apparatus includes two wafer supporting/retaining assemblies. The "P" in the following tables represents a first wafer supporting/retaining assembly in the pre-alignment apparatus, while the "C" in the following tables represents a second wafer supporting/retaining assembly in the pre-alignment apparatus. The wafer is transferred between P and C by the pre-alignment apparatus. A CCD is used to measure the deviation in the transfer.

TABLE 1

Deviation in Transfer of Standard Wafer Not Using Wafer holders 1

P-C Transfer Deviation

| Test No. | X | Y | ΔX | ΔY |
|---|---|---|---|---|
| 1 | 0.001574 | −0.00275594 | | |
| 2 | 0.00255 | −0.00628 | 0.000976 | −0.00352406 |
| 3 | 0.00291 | −0.00972 | 0.00036 | −0.00344 |
| 4 | 0.00478 | −0.01145 | 0.00187 | −0.00173 |
| 5 | 0.00521 | −0.0179667 | 0.00043 | −0.0065167 |
| 6 | 0.005828 | −0.02111 | 0.000618 | −0.0031433 |
| 7 | 0.0063034 | −0.024764 | 0.0004754 | −0.003654 |
| 8 | 0.00651934 | −0.02832269 | 0.00021594 | −0.00355869 |
| 9 | 0.006958 | −0.0314453 | 0.00043866 | −0.00312261 |
| 10 | 0.00710947 | −0.0352679 | 0.00015147 | −0.0038226 |
| 11 | 0.00935267 | −0.0358076 | 0.0022432 | −0.0005397 |
| 12 | 0.0102982 | −0.0378745 | 0.00094553 | −0.0020669 |
| 13 | 0.0107257 | −0.0418095 | 0.0004275 | −0.003935 |
| 14 | 0.0113864 | −0.0495426 | 0.0006607 | −0.0077331 |
| 15 | 0.0124081 | −0.0523675 | 0.0010217 | −0.0028249 |
| 16 | 0.0123012 | −0.0566238 | −0.0001069 | −0.0042563 |
| 17 | 0.0128328 | −0.0603019 | 0.0005316 | −0.0036781 |
| 18 | 0.0131017 | −0.0642954 | 0.0002689 | −0.0039935 |
| 19 | 0.0147246 | −0.0658282 | 0.0016229 | −0.0015328 |
| 20 | 0.0150728 | −0.0701513 | 0.0003482 | −0.0043231 |
| Average | | | 0.00071046 | −0.003547124 |

TABLE 2

Deviation in Transfer of Standard Wafer Using Wafer holders 1

P-C Transfer Deviation

| Test No. | X | Y | ΔX | ΔY |
|---|---|---|---|---|
| 1 | −0.000356619 | −0.00385102 | | |
| 2 | −0.00161318 | −0.00666907 | −0.0012566 | −0.00281805 |
| 3 | −0.0028506 | −0.01066 | −0.0012374 | −0.00399093 |
| 4 | −0.00344153 | −0.0128016 | −0.0005909 | −0.0021416 |
| 5 | −0.00481948 | −0.0161912 | −0.001378 | −0.0033896 |
| 6 | −0.00652738 | −0.0203959 | −0.0017079 | −0.0042047 |
| 7 | −0.00763675 | −0.0231905 | −0.0011094 | −0.0027946 |
| 8 | −0.00902069 | −0.0273196 | −0.0013839 | −0.0041291 |
| 9 | −0.0103534 | −0.0309298 | −0.0013327 | −0.0036102 |
| 10 | −0.0120497 | −0.0354946 | −0.0016963 | −0.0045648 |
| 11 | −0.01316 | −0.0395278 | −0.0011103 | −0.0040332 |
| 12 | −0.0147315 | −0.0434588 | −0.0015715 | −0.003931 |
| 13 | −0.0165011 | −0.0472626 | −0.0017696 | −0.0038038 |

TABLE 2-continued

Deviation in Transfer of Standard Wafer Using Wafer holders 1

| Test No. | P-C Transfer Deviation | | | |
|---|---|---|---|---|
| | X | Y | ΔX | ΔY |
| 14 | −0.0178111 | −0.0513125 | −0.00131 | −0.0040499 |
| 15 | −0.0191751 | −0.0551721 | −0.001364 | −0.0038596 |
| 16 | −0.0204647 | −0.0587809 | −0.0012896 | −0.0036088 |
| 17 | −0.0219834 | −0.0623109 | −0.0015187 | −0.00353 |
| 18 | −0.0233297 | −0.0664595 | −0.0013463 | −0.0041486 |
| 19 | −0.0239908 | −0.0686908 | −0.0006611 | −0.0022313 |
| 20 | −0.0251289 | −0.0723574 | −0.0011381 | −0.0036666 |
| Average | | | −0.001304 | −0.003605599 |

In Tables 1 and 2, ΔX and ΔY denote distances in the X and Y directions between two positions to which the wafer is transferred in the present test and last test, respectively. Table 1 shows P-C transfer deviation in 19 tests performed on the wafer transport system not using the wafer holders 1, and the average ΔX and ΔY values are 0.00071046 mm and 0.003547124 mm, respectively. Table 2 shows P-C transfer deviation in 19 tests performed on the wafer transport system using the wafer holders 1, and the average ΔX and ΔY values are 0.001304 mm and 0.003605599 mm, respectively. From a simple calculation, the differences between the P-C transfer deviation averages under the same test conditions can be obtained as ΔΔX=0.000593 mm and ΔΔY=0.00005847 mm, both less than 1 μm. Therefore, according to this embodiment, the service life extended suckers only lead to minimal increases in wafer transfer deviation.

Embodiment 4

In this embodiment, a wafer transfer method is provided. The method includes: securing the wafer holders 1 to the wafer transfer apparatus by pressing the first fixing members 13; positioning the wafer transfer apparatus under a wafer with the wafer holders 1 facing upward and placing the wafer onto the first skirts 121 of the wafer holders 1; and evacuating the gas channel in the wafer transfer apparatus and forming a vacuum therein; wherein, the first skirts 121 deform and keep deforming at the grooves 112 which are each formed at an outer side of a bottom of a corresponding one of the first skirts 121 until the wafer comes into contact with wafer supports 3.

This wafer transfer method uses the above-described wafer transfer apparatus incorporating the wafer holders of the disclosure to transfer a wafer with warpage. In addition, since a workpiece stage travels limited distances during the transfer of a wafer, the wafer transfer apparatus and method can also be applied to workpiece stages.

In addition to warped wafers, the above-described wafer holder is also suitable for vacuum retention of any other large-sized thin substrate with warpage.

Further, the wafer holder of the present disclosure can be also used in wafer pre-alignment apparatuses whose functions involve the fixation or transfer of wafers. Similarly, in this case, the wafer holder will well accommodate wafer warpage, enhance transfer accuracy and allows for more reliable retention. Any and all modifications to the above configurations of the wafer holder and wafer transfer apparatus and system are intended to be embraced in the scope of the present disclosure.

The embodiments disclosed herein are described in a progressive manner, with the description of each embodiment focusing on its differences from others. Reference can be made between the embodiments for their identical or similar parts. The description presented above is merely that of a few preferred embodiments of the present disclosure and does not limit the scope thereof in any sense. Any and all changes and modifications made by those of ordinary skill in the art based on the above teachings fall within the scope as defined in the appended claims.

The invention claimed is:

1. A wafer holder, comprising a holder body and a sucker, wherein
the holder body defines a first opening; and
the sucker comprises a first skirt, wherein the first skirt is located on a top surface of the holder body and connected to the first opening, a groove, comprising a first side wall, a second side wall, and a bottom surface connecting the first side wall and the second side wall, is formed at a joint between the first skirt and the first opening, and the groove is located at an outer side of the first skirt;
wherein the first side wall is closer to the first opening than the second side wall; the second side wall is slanted away from the first opening,
wherein the groove extends from the top surface of the holder body into the holder body and ends at the bottom surface.

2. The wafer holder of claim 1, wherein the first opening is circular and the holder body has a shape of a hollow cylinder;
the first opening has a diameter ranging from 8.2 mm to 9.0 mm.

3. The wafer holder of claim 2, wherein the holder body has an outer diameter ranging from 13.0 mm to 17.0 mm and a height ranging from 0.4 mm to 0.6 mm.

4. The wafer holder of claim 1, wherein the first skirt has a shape of a truncated cone and the groove is formed in a surface of the holder body and is annular.

5. The wafer holder of claim 4, wherein the first skirt has an outer diameter ranging from 15.0 mm to 17.0 mm.

6. The wafer holder of claim 4, wherein the first skirt has a height ranging from 0.8 mm to 1.6 mm.

7. The wafer holder of claim 4, wherein the first skirt has an exterior surface, and an angle between the exterior surface and the top surface of the holder body ranges from 18° to 24°.

8. The wafer holder of claim 4, wherein the first skirt has an interior surface, and an angle between the interior surface and the top surface of the holder body ranges from 16° to 23°.

9. The wafer holder of claim 4, wherein the groove has a depth ranging from 0.2 mm to 0.3 mm.

10. The wafer holder of claim 4, wherein the groove has an inner diameter ranging from 9.8 mm to 10.6 mm.

11. The wafer holder of claim 4, wherein the bottom surface of the groove has a width ranging from 0.3 mm to 0.5 mm.

12. The wafer holder of claim 1, wherein the first side wall is recessed at a middle position thereof toward the first opening to appear as an annular curved surface.

13. The wafer holder of claim 12, wherein the second side wall is slanted away from the first opening at an angle ranging from 90° to 180°.

14. A wafer transfer apparatus, comprising an apparatus body and a plurality of wafer holders of claim 1, wherein the plurality of wafer holders are secured to the apparatus body.

15. The wafer transfer apparatus of claim 14, further comprising a plurality of wafer supports and a seal, wherein:

the apparatus body defines a plurality of first holes which are circular and the apparatus body comprises a bottom surface in which a trench is formed in communication with the first holes;

the apparatus body further comprises a top surface, each of the wafer supports is cylindrical and defines a second hole in center, each of the wafer supports is received in a corresponding one of the first holes in such a manner that it protrudes out from the top surface of the apparatus body and into the first opening of a corresponding one of the wafer holders but located below the first skirt of the wafer holder; and the seal is attached to the bottom surface of the apparatus body, and spaces within the trench, the first holes and the second holes together form a gas channel.

16. The wafer transfer apparatus of claim 15, wherein numbers of the wafer holders and wafer supports are 3 and equal to each other, with centers of the wafer supports defining a polygon.

17. The wafer transfer apparatus of claim 16, wherein when the wafer transfer apparatus is transferring a wafer, the first skirts together support the wafer in such a manner that a center of gravity of the wafer is encompassed by the polygon.

18. The wafer transfer apparatus of claim 15, the gas channel is evacuated to form a vacuum therein when the wafer transfer apparatus is transferring a wafer.

19. The wafer transfer apparatus of claim 15, wherein each of the wafer supports has a first end and a second end, the first end having a diameter greater than a diameter of the first hole, the second end having a diameter smaller than the diameter of the first hole, the first end received in the first opening so that a top surface of the first end is higher than the top surface of the apparatus body while a bottom surface of the second end is lower than the top surface of the apparatus body.

20. The wafer transfer apparatus of claim 15, wherein upon formation of vacuum in the gas channel, the wafer support is brought into contact with a wafer as a result of deformation of the first skirt.

21. The wafer transfer apparatus of claim 20, wherein when the wafer is in contact with the wafer support, a weight of the wafer exceeds a support force provided by the first skirt to the wafer.

22. The wafer transfer apparatus of claim 14, wherein each of the wafer holders further comprises a first fixing member configured to secure the wafer holder to the apparatus body, and wherein the holder body has a front side on which the first skirt is located and a back side on which the first fixing member is located.

23. The wafer transfer apparatus of claim 22, wherein the first fixing member comprises a second skirt and a third skirt, the second and third skirts both coupled to the holder body, the second skirt surrounding the first opening, the third skirt surrounding the second skirt, the second and third skirts together forming a V-shaped groove.

24. The wafer transfer apparatus of claim 23, wherein the first fixing member further comprises a bottom surface of the sucker, which is located between the second and third skirts, and wherein when the wafer transfer apparatus is transferring a wafer, the second skirt, the third skirt and the bottom surface of the sucker are pressed against the apparatus body.

25. The wafer transfer apparatus of claim 24, wherein when the wafer transfer apparatus is transferring the wafer, the holder body turns into a flat-sheet shape.

26. The wafer transfer apparatus of claim 24, wherein the apparatus body further comprises suction surfaces each surrounding a corresponding one of the first holes and a body surface, the suction surfaces being lower than the body surface, the suction surfaces each having an annular shape, and wherein when the wafer transfer apparatus is transferring the wafer, the second skirt, the third skirt and the bottom surface of the sucker are pressed against a corresponding one of the suction surfaces.

27. The wafer transfer apparatus of claim 26, wherein the second skirt pressed against the suction surface has an inner diameter greater than a diameter of a first end, and the third skirt pressed against the suction surface has an outer diameter smaller than an outer diameter of the suction surface.

28. A wafer transfer method, using the wafer transfer apparatus of claim 22, the method comprising:
securing the wafer holders to the wafer transfer apparatus by pressing the first fixing members;
positioning the wafer transfer apparatus under a wafer with the wafer holders facing upward and placing a wafer onto first skirts of the wafer holders; and
evacuating a gas channel in the wafer transfer apparatus and forming a vacuum therein;
wherein, the first skirts deform and keep deforming at the grooves which are each formed at an outer side of a bottom of a corresponding one of the first skirts until the wafer comes into contact with wafer supports.

29. The wafer transfer apparatus of claim 14, wherein each of the wafer holders is secured to the apparatus body by means of a second fixing member comprising a flange, the flange defining a second opening which is aligned with the first opening of the wafer holder and larger in size than the first opening, the flange configured to press the holder body against the apparatus body.

* * * * *